United States Patent [19]

Nakashima et al.

[11] Patent Number: 5,100,809
[45] Date of Patent: Mar. 31, 1992

[54] METHOD OF MANUFACTURING SEMICONDUCTOR DEVICE

[75] Inventors: Nobuhisa Nakashima; Tokumitsu Sakamoto, both of Fukuoka, Japan

[73] Assignee: Mitsubishi Denki Kabushiki Kaisha, Tokyo, Japan

[21] Appl. No.: 651,012

[22] Filed: Feb. 5, 1991

[30] Foreign Application Priority Data

Feb. 22, 1990 [JP] Japan .................. 2-43225

[51] Int. Cl.⁵ .......................................... H01L 21/46
[52] U.S. Cl. ................................. 437/7; 437/6; 437/210; 437/246; 437/974; 437/235
[58] Field of Search ............. 437/7, 6, 974, 946, 437/245, 246, 210; 357/30, 39

[56] References Cited

U.S. PATENT DOCUMENTS

| 3,289,267 | 12/1966 | Ullrich | 437/946 |
| 3,597,269 | 8/1971 | Chang et al. | 437/946 |
| 3,852,876 | 12/1974 | Sheldon et al. | 437/6 |
| 3,909,321 | 9/1975 | Roberts | 437/6 |
| 4,638,553 | 1/1987 | Nilarp | 437/6 |

FOREIGN PATENT DOCUMENTS

| 0190934 | 8/1986 | European Pat. Off. | 437/6 |
| 0007475 | 1/1981 | Japan | 437/6 |
| 61-158171 | 7/1986 | Japan . | |
| 0045168 | 2/1989 | Japan | 437/6 |
| 2132412 | 7/1984 | United Kingdom | 437/6 |

Primary Examiner—Brian E. Hearn
Assistant Examiner—Michael Trinh
Attorney, Agent, or Firm—Oblon, Spivak, McClelland, Maier & Neustadt

[57] ABSTRACT

A silicon substrate (20) having a pnpn structure is soldered to a metal plate (10). A silicon oxide film (16) is naturally formed on the side surface of the silicon substrate during a process of removing defective part of the side surface, and a metal component penetrates into the silicon oxide film. The silicon substrate is dipped into an etchant to etch the silicon oxide film, so that a leak current through the metal component is effectively prevented.

6 Claims, 6 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device such as a reverse-blocking three-terminal thyristor (referred to as "SCR" hereinafter) and the like.

2. Description of the Background Art

In a semiconductor device such as an SCR and the like, a plurality of pn junctions are formed in a semiconductor substrate, and at least one of the pn junctions is exposed on a side surface of the semiconductor substrate. Thus, when the pn junction is exposed on the side surface of the semiconductor substrate, a concentration of electric field in a part of the exposed pn junctions causes withstand voltage of an element to decline, and therefore, the side surface of the semiconductor substrate where the pn junction is exposed is processed to have a bevel structure.

Figure 2:
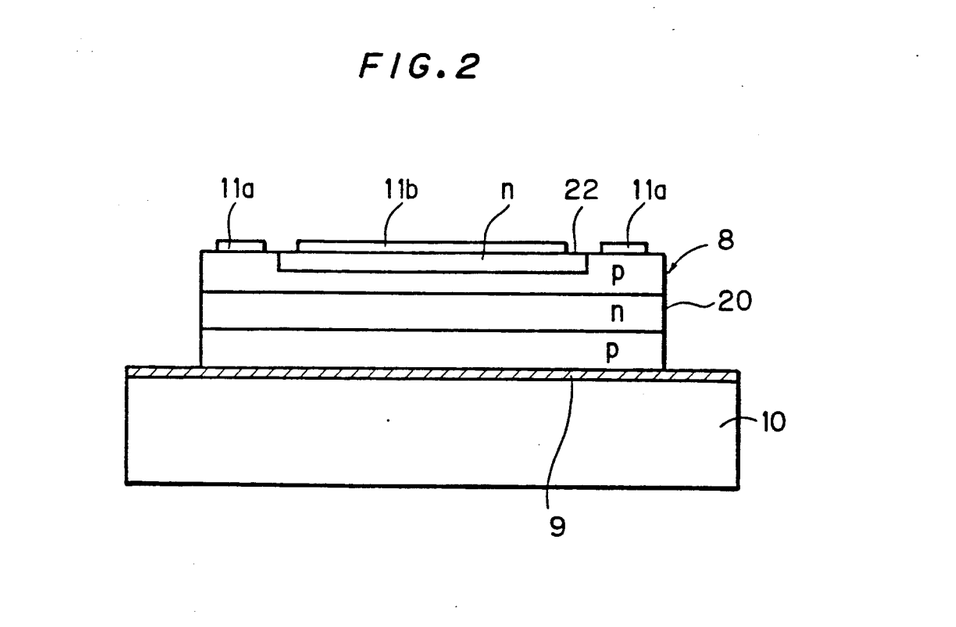
FIG. 2 is a sectional view showing another exemplary structure of the semiconductor device, to which the present invention can be applied.
Figure 3:
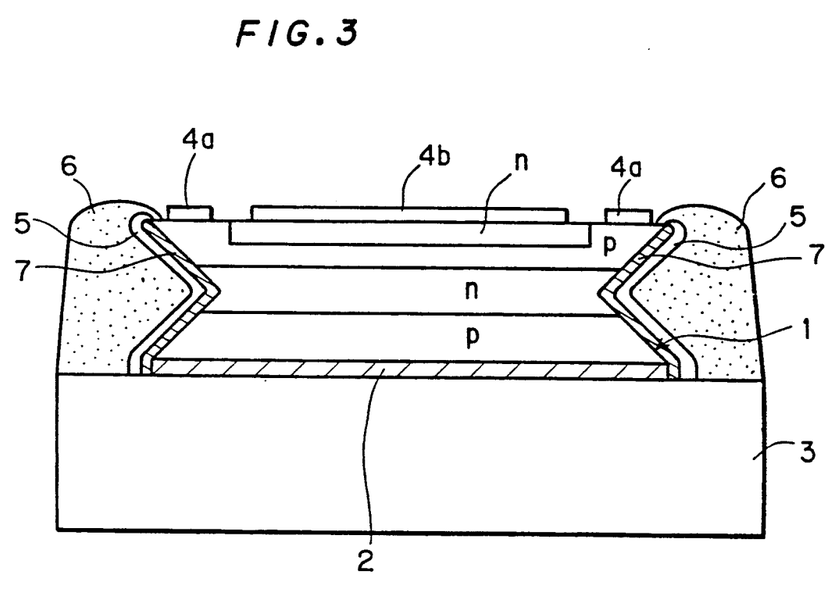
FIG. 3 is a sectional view showing a semiconductor device manufactured by a prior art method of manufacturing the same.

FIG. 3 is a sectional view showing an SCR manufactured by a prior art of manufacturing method to have a double positive bevel structure. Now, steps of manufacturing the SCR will be described with reference to FIG. 2.

First, a pnpn structure composed of three pn functions is formed in a silicon (Si) substrate 1, and thereafter, a circumferential part of the Si substrate 1 is cut. In this way, there are two of the pn junctions exposed in the side surface of the Si substrate 1.

Then, the Si substrate 1 is fixed to a top surface of a metal plate 3 made of molybdenum (Mo) or wolfram (W) by soldering with an aluminum layer 2. The metal plate 3 serves as an anode electrode plate and also as a temperature compensating plate. Further, after a gate electrode layer 4a and a cathode electrode layer 4b are selectively formed on the top major surface of the Si substrate 1, the side surface of the Si substrate having the pn junctions exposed is processed by sandblasting so as to have a double positive bevel structure.

On processing to obtain the bevel structure, many minute faults such as fissures, cracks and the like are caused in the side surface of the Si substrate 1, and hence, the side surface of the Si substrate 1 is spin-etched with an etchant which consists of hydrofluoric acid (HF) mixed with nitric acid ($HNO_3$). Because of the etching, the side surface of the Si substrate 1 is removed by approximately 20 $\mu$m to eliminate the faults, and consequently, the side surface of the Si substrate 1 is flattened and cleaned as well.

After that, the side surface of the Si substrate 1 is cleaned in pure water and dehydrated in organic solvent such as acetone and the like. Then, a varnished layer 5 for protection and an insulating layer 6 of silicone rubber or the like are formed on the side surface of the Si substrate 1. After steps of packaging and the like, the SCR having the double positive bevel structure can be obtained.

Recently in a field of semiconductor devices for electric power, a semiconductor device of withstand voltage as much as thousands of volts has been developed. With such semiconductor devices, enhancing voltage resistance and reliability is especially important. However, in a semiconductor device obtained by the above-mentioned prior manufacturing method, there arises the problem that a decline of withstand voltage in a high electric field is caused.

For example, on etching the side surface of the Si substrate 1 processed in the bevel structure, the metal plate 3 of Mo, W or the like is simultaneously etched away. Because of this, as shown in FIG. 3, an oxide film 7 containing much heavy metal like Mo or W is deposited on the side surface of the Si substrate 1. This phenomenon is well known. When the exposed surface of the pn junctions is covered with such an oxide film 7, leak current through the heavy metal in the oxide film 7 increases. As a result, the decline of withstand voltage of an element in a high electric field, as previously mentioned, is caused.

SUMMARY OF THE INVENTION

According to the present invention, a method of manufacturing a semiconductor device comprises the steps of fixing one of major surfaces of a semiconductor substrate which includes one or more pn junctions and has the pn junction exposed in its side surface, to a top surface of a metal plate; etching the side surface of the semiconductor substrate fixed to the metal plate; removing an oxide film formed on the side surface of the semiconductor substrate in the previous etching step; and covering the side surface of the semiconductor substrate from which the oxide film has been removed, with a passivation film.

In another aspect of the present invention, a method of manufacturing a semiconductor device comprises the steps of fixing one of major surfaces of a semiconductor substrate which includes one or more pn junctions and has the pn junction exposed in its side surface, to a top surface of a metal plate having a diameter larger than that of the semiconductor substrate; removing shoulder parts of the top surface of the metal plate so as to obtain a step configuration in a circumferential part of the top surface of the metal plate; forming an etching-resistant mask layer on the step configuration; etching the side surface of the semiconductor substrate fixed to the metal plate; removing an oxide film formed on the side surface of the semiconductor substrate in the previous etching step; removing the mask layer; and covering the side surface of the semiconductor substrate from which the oxide film has been removed, with a passivation film.

In still another aspect of the present invention, a method of manufacturing a semiconductor device comprises the steps of fixing a bottom major surface of a semiconductor substrate which includes one or more pn junctions and has the pn junction exposed in its side surface, to a top surface of a metal plate; selectively forming an electrode layer on a top major surface of the semiconductor substrate; selectively removing the exposed side surface of the semiconductor substrate to thereby obtain a slant surface at the side surface; etching the slant side surface of the semiconductor substrate; removing an oxide film formed on the side surface of the semiconductor substrate in the previous etching step; and covering the side surface of the semiconductor substrate from which the oxide film has been removed, with a passivation film.

Preferably, the step of removing the oxide film comprises the step of etching the oxide film in a dilute hydrofluoric acid where the ratio of HF to $H_2O$ is substantially 1:4.

According to the present invention, since the side surface of the semiconductor substrate where the pn junction is exposed is etched and then the oxide film formed because of the etching is removed, the surface of the exposed pn junction is prevented from being covered with the oxide film containing heavy metal and the like, unlike the prior art embodiments. Thus, the leak current through the heavy metal and the like in the oxide film, which causes a decline of withstand voltage, can be inhibited.

In particular, the step configuration is formed by removing the shoulder parts of the metal plate, the mask layer is formed thereon, and thereafter the etching process is performed, in order to reduce an amount of the metal plate etched away. Consequently, an amount of the metal mixed in the oxide film can be reduced.

Moreover, in the semiconductor device processed to have the slant side surface of the semiconductor substrate where the pn junction is exposed, the slant side surface of the semiconductor substrate is etched, and then the oxide film formed because of the etching is removed, so that a decline of withstand voltage can be avoided.

The removal of the oxide film is preferably carried out by etching, and particularly, the etchant specified in the preferable embodiment according to the invention is most appropriately employed.

As has been described, in an aspect of the present invention, since the side surface of the semiconductor substrate where the pn junction is exposed is etched and then the oxide film formed because of the etching is removed, the exposed surface of the pn junction is prevented from being covered with the oxide film containing heavy metal and the like, unlike the prior art embodiments. Consequently. The leak current through the heavy metal and the like in the oxide film is prevented, and the semiconductor device highly reliable and having an enhanced withstand voltage can be obtained.

In another aspect of the present invention, the step configuration is formed by removing the shoulder parts of the metal plate, the mask layer is formed thereon, and thereafter the etching process is performed, in order to reduce an amount of the metal plate etched away. Accordingly, an amount of the metal contained in the oxide film can be reduced. As a result, even when the removal of the oxide film is unsatisfactory, the leak current can be substantially prevented. Moreover, the mask layer is no obstruction to etching the semiconductor substrate, because it is positioned below the side surface of the semiconductor substrate.

In still another aspect of the present invention, in the semiconductor device processed to have the slant side surface of the semiconductor substrate where the pn junction is exposed, the slant side surface of the semiconductor substrate is etched, and then the oxide film formed because of the etching is removed, so that a decline of withstand voltage can be avoided. Consequently, this method is very effective in manufacturing a semiconductor device, such as a thyristor and the like, which has a slant side surface and has an enhanced withstand voltage.

To efficiently remove the oxide film, it is preferable to use a dilute hydrofluoric acid in which the ratio of HF to $H_2O$ is substantially 1:4 in etching the oxide film.

Accordingly, it is an object of an present invention to prevent a decline of withstand voltage in a semiconductor device having a pn junction exposed in a side surface of its semiconductor substrate, and to enhance a reliability of the semiconductor device.

These and other objects, features, aspects and advantages of the present invention will become more apparent from the following detailed description of the present invention when taken in conjunction with the accompanying drawings.

DETAILED DESCRIPTION OF THE PREFERRED EMBODIMENT

FIGS. 1A through 1M show an embodiment where a method of manufacturing a semiconductor device according to the present invention is applied to an SCR having a double positive bevel structure. Now the manufacturing steps will be explained below.

Figure 1A:
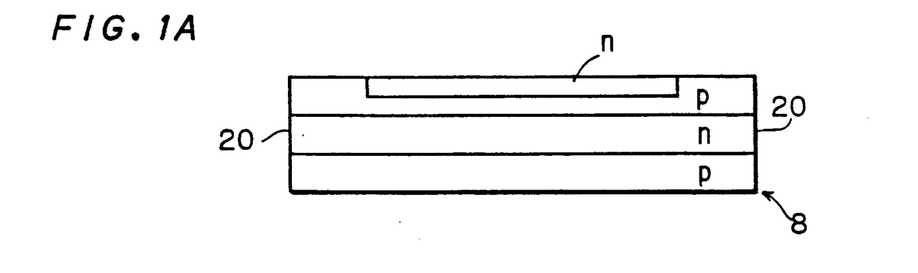
FIGS. 1A through 1M are sectional views showing the steps in an embodiment, or a method of manufacturing a semiconductor device, according to the present invention.

As shown in FIG. 1A, gallium (Ga), phosphorus (P) and the like are adequately diffused into a Si substrate 8 serving as a semiconductor substrate to form a pnpn structure composed of three pn junctions. Then, a circumferential region of the Si substrate 8 is cut, and two of the pn junctions of the pnpn structure are exposed in a side surface 20 of the Si substrate 8.

Figure 1B:
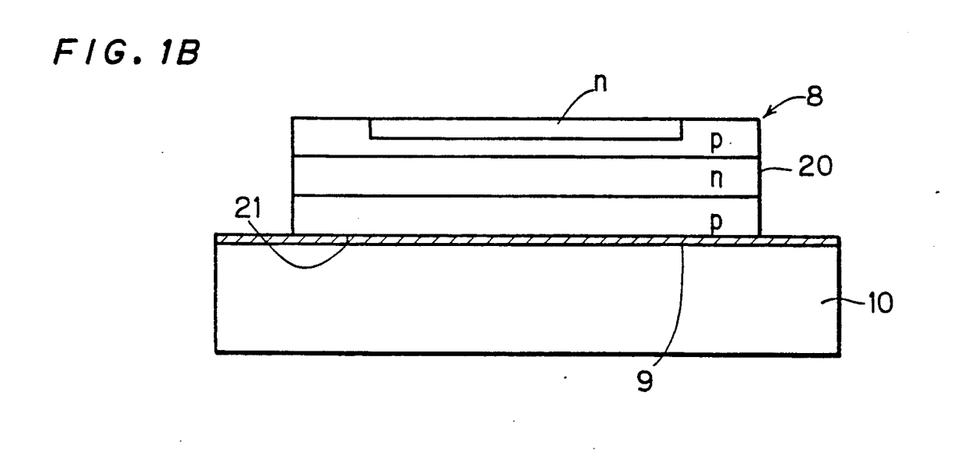
Figure 1C:
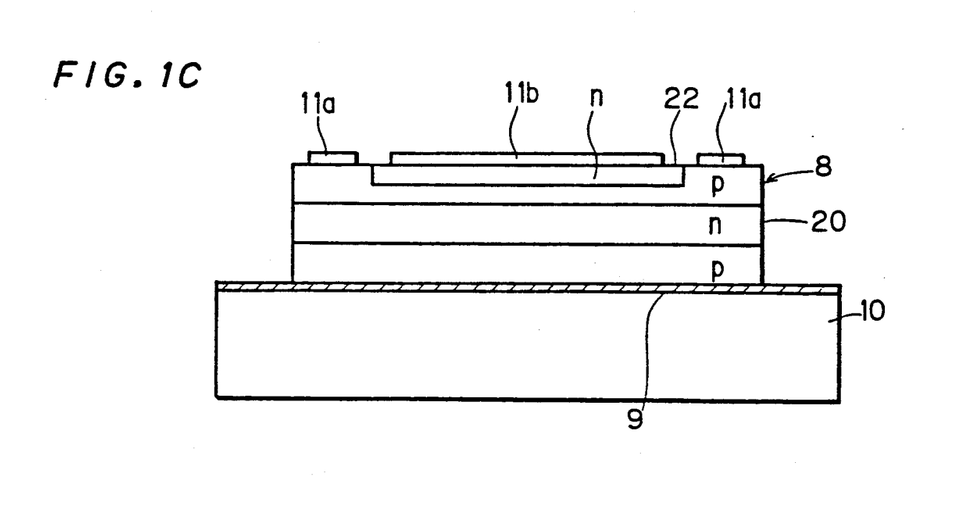

Furthermore, as shown in FIG. 1B, a bottom major surface 21 of the Si substrate 8 is fixed to a top surface of a metal plate 10 made of Mo or W and serving as an anode electrode and also as a temperature compensating plate by soldering with an aluminum layer 9. Specifically, the aluminum layer 9 reacts to the Si substrate 8 to make an Al-Si eutectic alloy, and with the top surface of the metal plate 10 wet with the alloy, the Si substrate 8 is connected to the metal plate 10. After that, as shown in FIG. 1C, by vapor deposition or sputtering, a gate electrode layer 11a and a cathode electrode layer 11b are selectively formed of aluminum or the like on a top surface 22 of the Si substrate 8.

Figure 1D:
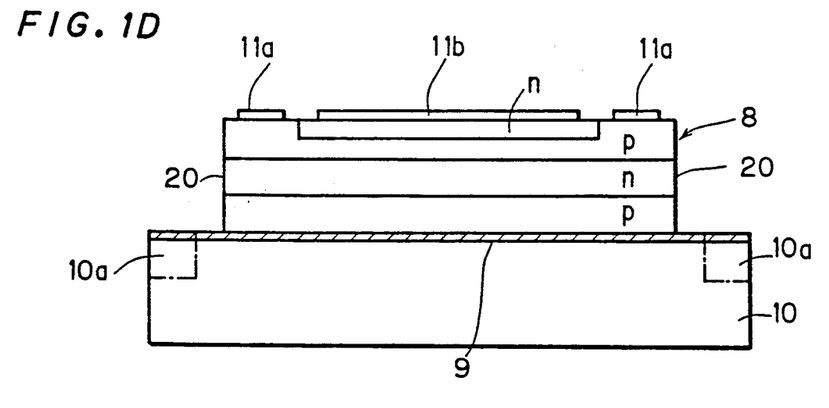
Figure 1E:
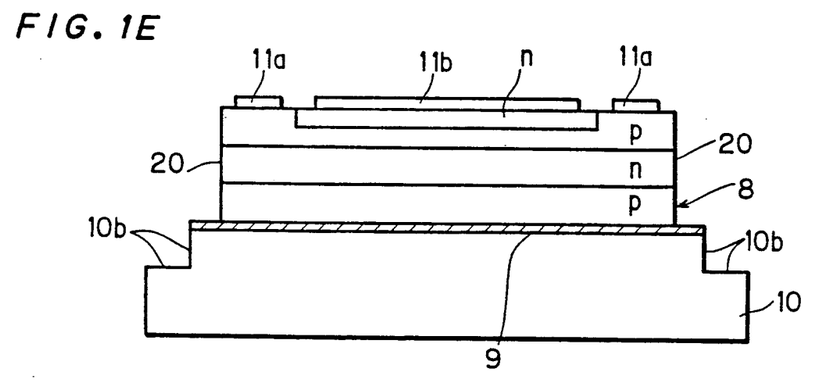
Figure 1F:
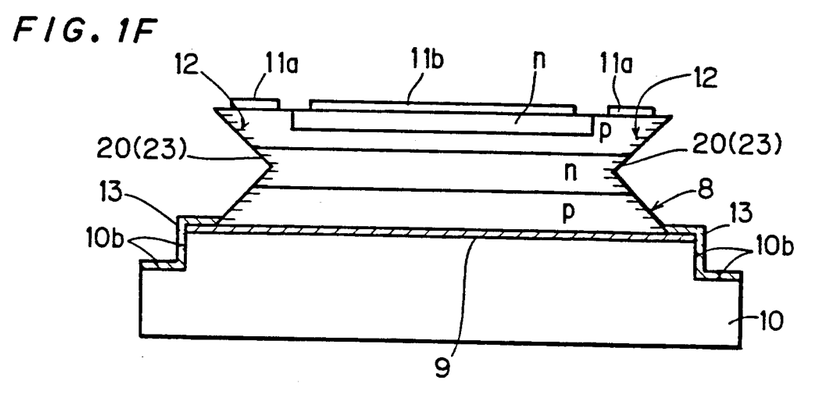

Furthermore, as shown in FIG. 1D, shoulder parts 10a at circumferential regions in the top surface of the metal plate 10 are cut with a cutting tool and removed. The removal of the shoulder parts 10a is performed for convenience of the following etching step. Then, as shown in FIG. 1E. the side surface 20 of the Si substrate 8 is polished by sandblasting so as to compensate a cutting error in the above-mentioned cutting step with the cutting tool for aligning in the vertical direction, namely, centering. After that, as shown in FIG. IF, the polished side surface 20 of the Si substrate 8 is processed by sandblasting to have a double positive bevel structure 23.

With the sandblasting to bevel the side surface 20, many faults 12 are caused in the side surface 20 of the Si substrate 8. An exposed surface of the aluminum layer 9 and a step configuration 10b formed in the shoulder part of the metal plate 10 by cutting as mentioned above are contaminated by attached sand and the like due to the sandblasting, and thus a contaminator layer 13 is formed.

Figure 1G:
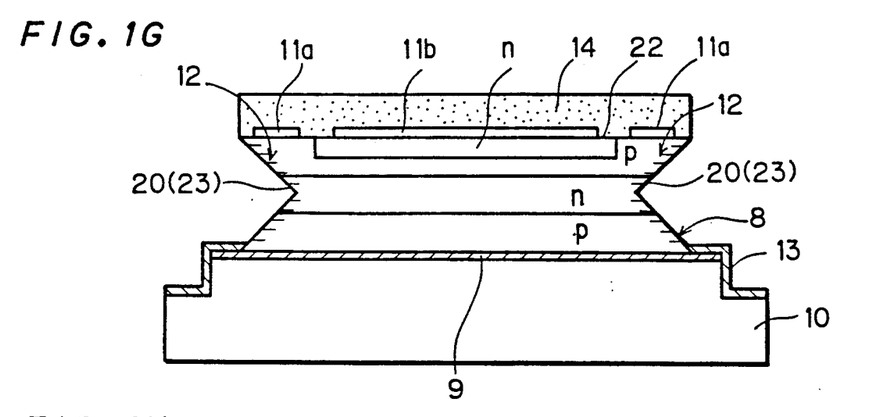
Figure 1H:
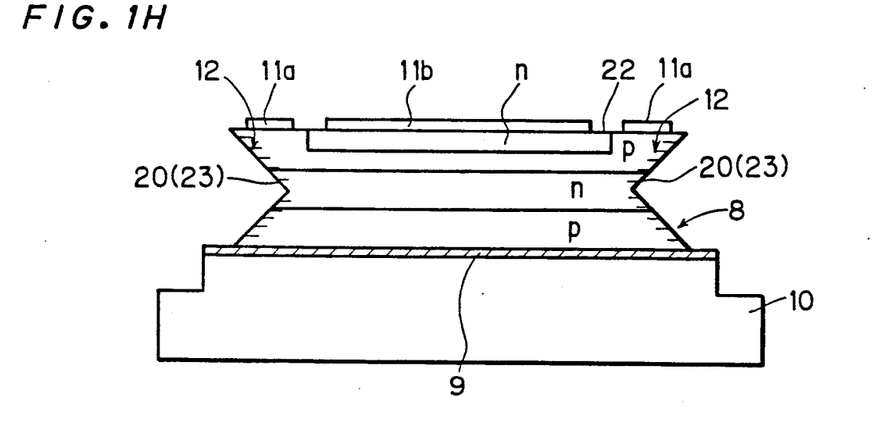

Then, to remove the contaminator layer 13 together with a surface layer of the metal plate 10, as shown in FIG. 1G, a mask layer 14 is formed on the top major surface 22 of the Si substrate 8 for protecting it from etching. After that, as shown in FIG. 1H, the surface layer of the metal plate 10 (made of Mo or W) along with the contaminator layer 13 are etched away in an etchant which consists of HNO$_3$ and H$_2$O with the ratio of 1:1. The etchant does not erode Si away, and the surface of the Si substrate 8 is left without being etched. Then, the mask layer 14 is removed, and the remaining part is washed with water.

Figure 1I:
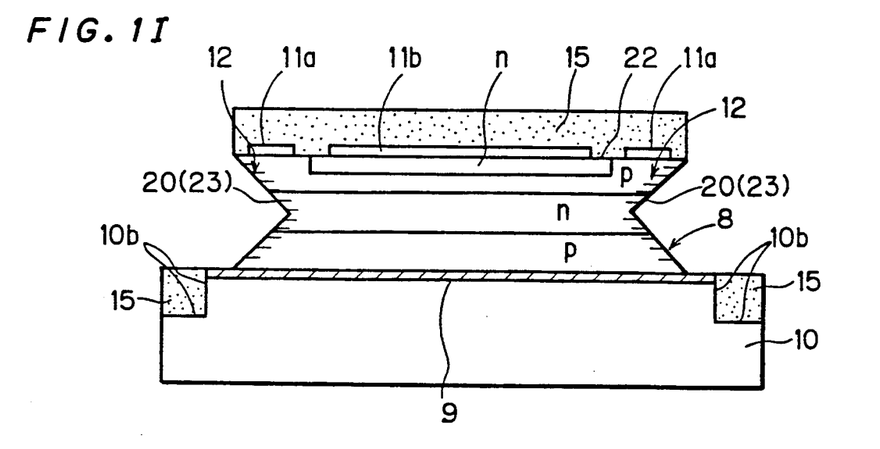

Then, in order to remove the faults 12 in the side surface of the Si substrate 8, as shown in FIG. 1I, a mask layer 15 is formed of resin on the top major surface 22 of the Si substrate 8 and the surface of the metal plate 10 cut down to the step configuration 10b, for protecting them from being etched. This is an etching-resistant mask provided for reducing an amount of Mo or W etched away, of which the metal plate is formed, as much as possible in the following etching step, so as to cope with the situation previously mentioned as the disadvantage in the prior art embodiments. The side surface 20 of the Si substrate 8 is subjected to spin-etching with an etchant which consists of HF and HNO$_3$ mixed with the ratio of 3:7. As a result, with the side surface 20 of the Si substrate 8 removed by approximately 20 μm, the faults 12 are eliminated, and thus, the side surface 20 of the Si substrate 8 is flattened and cleaned as well. At this time, since the shoulder parts of the metal plate 10 is cut in the step configuration 10b, the mask layer 15 is no obstruction to etching, so that the side surface of the Si substrate 8 can be uniformly etched.

Figure 1J:
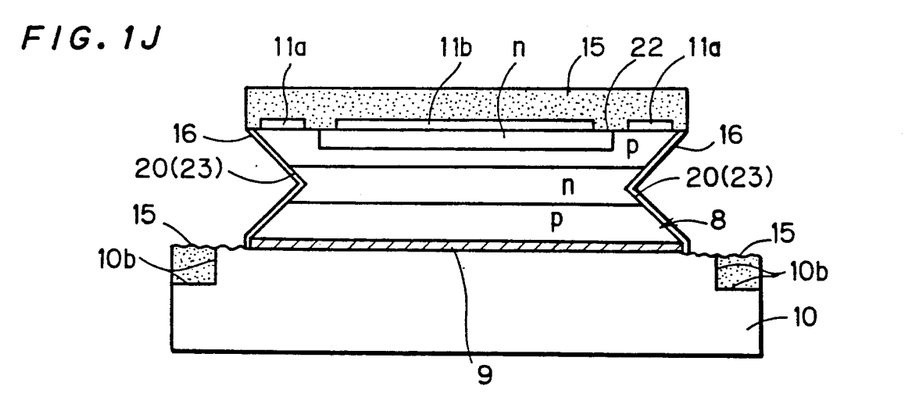

Meanwhile, if the surface of the step configuration 10b is masked with the above-mentioned mask layer 15, the surface of each of the metal plate 10 and aluminum layer 9 cannot be completely covered. Hence, a part of each of the aluminum layer 9 and metal plate is exposed below the side surface of the Si substrate 8, and the exposed aluminum layer 9 and metal plate 10 below the same are etched simultaneously with the side surface 20 of the Si substrate 8 being etched away. Then, as shown in FIG. 1J, an oxide film 16 containing Al and heavy metal, such as Mo or W of which the metal plate is formed, is deposited on the side surface 20 of the Si substrate 8. As stated above, if the oxide film 16 is left, it causes a decline of withstand voltage of an element in a high electric field.

Figure 1K:
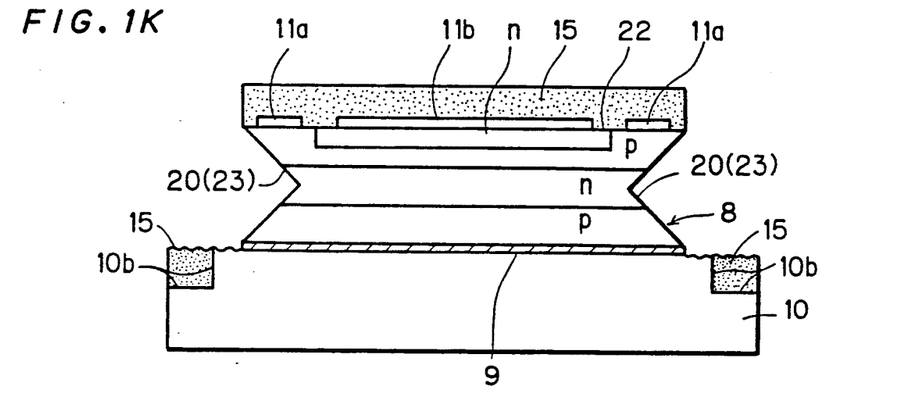

In order to remove the oxide film 16 which is a cause of the decline of withstand voltage, the Si substrate 8 and the metal plate are thoroughly dunked in an etchant, that is a dilute hydrofluoric acid in which the ratio of HF to H$_2$O is substantially 1:4. The oxide film 16 is subjected to a wet etching with the dilute hydrofluoric acid, and the state shown in FIG. 1k is obtained.

Figure 1L:
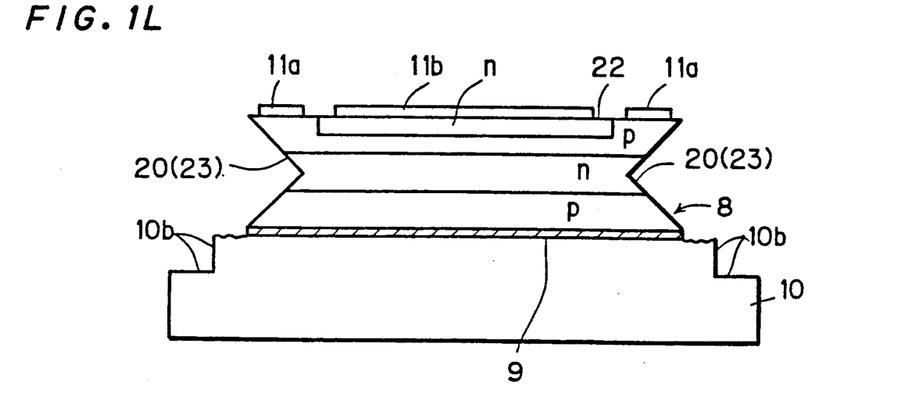
Figure 1M:
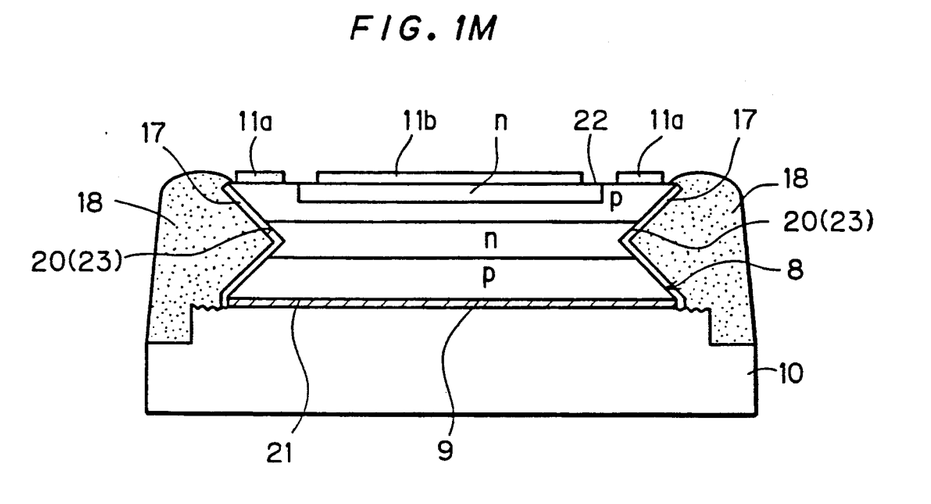

Then, as shown in FIG. 1L, after the mask layer 15 is removed and the remaining part is washed with pure water, an organic solvent like aceton is used to dehydrate. As shown in FIG. 1M, a varnished layer 17 serving as a passivation film and an insulating layer 18 made of silicone rubber is formed on the side surface 20 of the Si substrate 8. After that, the steps of packaging and the like are carried out so as to obtain the SCR having the double positive bevel structure.

Thus, the step of removing the oxide film 16 containing heavy metal and the like is included and the step of forming the varnished layer 17 and the insulating layer 18 is followed, so that the resultant SCR can get rid of leak current through the heavy metal and the like in the oxide film 16. As a result, a decline of withstand voltage in a high electric field can be prevented, and the reliability of the device can be enhanced.

Although a case where a Si substrate is used as a semiconductor substrate has been described in conjunction with the above embodiment, a semiconductor to be employed is not limited especially to Si, but other semiconductors like GaAs can be used to implement the present invention.

Furthermore, although the dilute hydrofluoric acid where the ratio of HF to H$_2$O is 1:4 is used in removing the oxide film 16, an etchant to be employed is not limited to it, but an etchant containing HF alone or a mixture of HF, NH$_4$F and H$_2$O may be used. Moreover, the oxide film 16 may be removed by spin etching.

The present invention can be applied to a semiconductor device having a bevel structure other than the double positive bevel structure (generally, a slant structure). As for a semiconductor device without the bevel structure, the present invention can be utilized to any situation in which an oxide film containing a metal element is formed in a side surface of its semiconductor substrate due to etching, even if the side surface of the Si substrate 8 is cut in almost a right angle as shown in FIG. 2.

Although the present invention has been described and illustrated in detail, it is clearly understood that the same is by way of illustration and example only and is not to be taken by way of limitation, the spirit and scope of the present invention being limited only by the terms of the appended claims.

We claim:

1. A method of manufacturing a semiconductor device, comprising the steps of;
   (a) fixing a major surface of a semiconductor substrate to a top surface of a metal plate, wherein said semiconductor substrate has at least one PN junction a part of which exposes at a side surface of said semiconductor substrate and said metal plate has a diameter larger than a diameter of said semiconductor substrate;
   (b) removing a shoulder part of said metal plate to thereby obtain a step configuration at a circumferential region in said top surface of said metal plate;
   (c) forming on said step configuration a mask layer resistant to etching;
   (d) etching a part of said semiconductor substrate exposing said side surface, wherein an oxide film is naturally formed on said side surface of said semiconductor substrate during said etching;
   (e) removing said oxide film from said side surface;
   (f) removing said mask layer; and
   (g) covering said side surface of said semiconductor substrate with a passivation film.

2. The method of claim 1, wherein the step (b) comprises the step of:
   (b-1) removing said shoulder part with a mechanical tool.

3. The method of claim 1, wherein the step (a) comprises the steps of:
   (a-1) forming a solder layer on a whole region of said top surface of said metal plate;
   (a-2) soldering said semiconductor substrate on said solder layer through a first part of said solder layer.

4. The method of claim 3, wherein the step (b) comprises the steps of:

(b-1) removing a shoulder part of said metal plate together with a second part of said solder layer circumscribing said first part of said solder layer.

5. The method of claim 4, wherein the step (d) comprises the step of:
(d-1) etching said second part of said solder layer together with said part of said semiconductor substrate exposing said side surface.

6. A method of manufacturing a semiconductor device, comprising the steps of:
(a) fixing a major surface of a semiconductor substrate to a top surface of a metal plate, wherein said semiconductor substrate has at least one PN junction a part of which exposes at a side surface of said semiconductor substrate and said metal plate has a diameter larger than a diameter of said semiconductor substrate;
(b) removing a shoulder part of said metal plate to thereby obtain a step configuration at a circumferential region in said top surface of said metal plate;
(c) selectively removing a part of said semiconductor substrate exposing at said side surface to thereby obtain a slant surface at said side surface;
(d) forming on said step configuration a mask layer resistant to etching;
(e) etching said slant surface of said semiconductor substrate, wherein an oxide film is naturally formed on said surface of said semiconductor substrate during said etching;
(f) removing said oxide film from said slant surface;
(g) removing said mask layer; and
(h) covering said slant surface of said semiconductor substrate with a passivation film.

* * * * *